(12) United States Patent
Kim et al.

(10) Patent No.: US 8,277,561 B2
(45) Date of Patent: *Oct. 2, 2012

(54) CHEMICAL VAPOR DEPOSITION APPARATUS

(75) Inventors: Changsung Sean Kim, Gyunggi-do (KR); Chang Hwan Choi, Gyunggi-do (KR); Jong Pa Hong, Gyunggi-do (KR); Joong El Kim, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 455 days.

This patent is subject to a terminal disclaimer.

(21) Appl. No.: 12/257,131

(22) Filed: Oct. 23, 2008

(65) Prior Publication Data

US 2009/0260569 A1   Oct. 22, 2009

(30) Foreign Application Priority Data

Apr. 18, 2008  (KR) .................. 10-2008-0036094

(51) Int. Cl.
C23C 16/455  (2006.01)
C23C 16/06  (2006.01)
C23C 16/22  (2006.01)

(52) U.S. Cl. .................. 118/715; 156/345.33
(58) Field of Classification Search .......... 118/715; 156/345.33
See application file for complete search history.

(56) References Cited

U.S. PATENT DOCUMENTS

| | | |
|---|---|---|
| 3,757,733 A | 9/1973 | Reinberg |
| 4,033,287 A | 7/1977 | Alexander et al. |
| 4,307,283 A | 12/1981 | Zajac |
| 4,597,986 A | 7/1986 | Scapple et al. |
| 4,950,156 A | 8/1990 | Philipossian |
| 4,976,217 A | 12/1990 | Frijlink |
| 5,647,912 A | 7/1997 | Kaminishizono et al. |
| 5,686,151 A | 11/1997 | Imai et al. |
| 5,708,556 A | 1/1998 | van Os et al. |
| 5,792,272 A | 8/1998 | van Os et al. |
| 5,851,294 A | 12/1998 | Young et al. |
| 5,871,586 A | 2/1999 | Crawley et al. |
| 5,951,772 A | 9/1999 | Matsuse et al. |

(Continued)

FOREIGN PATENT DOCUMENTS

JP  04087323 A  *  3/1992

(Continued)

OTHER PUBLICATIONS

Korean Office Action, w/ English translation thereof, issued in Korean Patent Application No. KR 10-2008-0036094 dated Mar. 15, 2010.

(Continued)

*Primary Examiner* — Rudy Zervigon
(74) *Attorney, Agent, or Firm* — McDermott Will & Emery LLP

(57) ABSTRACT

There is provided a chemical vapor deposition apparatus improved in structure such that a reaction gas introduced into a reactor where deposition is performed flows at a substantially uniform rate to ensure a thin film is grown substantially uniformly on the deposition object. The chemical vapor deposition apparatus includes: a chamber; a reactor provided in the chamber to have a deposition object deposited therein; and a reservoir storing a reaction gas fed from the outside to introduce the reaction gas to the reactor, the reservoir having a cross-sectional area changing according to a flow path of the introduced reaction gas.

15 Claims, 7 Drawing Sheets

U.S. PATENT DOCUMENTS

| | | | |
|---|---|---|---|
| 5,980,999 A | 11/1999 | Goto et al. | |
| 6,020,570 A | 2/2000 | Taki et al. | |
| 6,178,918 B1 | 1/2001 | van Os et al. | |
| 6,206,976 B1 * | 3/2001 | Crevasse et al. | 118/720 |
| 6,325,855 B1 | 12/2001 | Sillmon et al. | |
| 6,375,750 B1 | 4/2002 | van Os et al. | |
| 6,446,572 B1 | 9/2002 | Brcka | |
| 6,474,257 B2 | 11/2002 | Jeng | |
| 6,478,877 B1 | 11/2002 | Sillmon et al. | |
| 6,497,783 B1 | 12/2002 | Suzuki et al. | |
| 6,666,920 B1 | 12/2003 | Sillmon et al. | |
| 6,676,758 B2 | 1/2004 | Sillmon et al. | |
| 6,716,289 B1 | 4/2004 | Sillmon et al. | |
| 6,846,364 B2 | 1/2005 | Pyo | |
| 7,390,366 B2 | 6/2008 | Shim | |
| 7,402,210 B2 | 7/2008 | Chen et al. | |
| 7,749,326 B2 | 7/2010 | Kim et al. | |
| 7,806,078 B2 | 10/2010 | Yoshida | |
| 2001/0003271 A1 | 6/2001 | Otsuki | |
| 2003/0084849 A1 | 5/2003 | Shim | |
| 2006/0263522 A1 | 11/2006 | Byun | |
| 2007/0079760 A1 | 4/2007 | Okabe et al. | |
| 2007/0090032 A1 | 4/2007 | Yoshida | |
| 2009/0165713 A1 | 7/2009 | Kim et al. | |
| 2009/0260569 A1 | 10/2009 | Kim et al. | |
| 2009/0260572 A1 | 10/2009 | Kim et al. | |
| 2009/0288604 A1 * | 11/2009 | Kim et al. | 118/726 |
| 2010/0024727 A1 | 2/2010 | Kim et al. | |

FOREIGN PATENT DOCUMENTS

| | | |
|---|---|---|
| JP | 5-267182 | 10/1993 |
| JP | 6-163422 | 6/1994 |
| JP | 07-235501 | 9/1995 |
| JP | 10-032169 | 2/1998 |
| JP | 2000-269141 A | 9/2000 |
| JP | 2003-203908 | 7/2003 |
| JP | 2006-032459 | 2/2006 |
| KR | 10-230348 B1 | 8/1999 |
| KR | 0364571 | 12/2002 |
| KR | 10-703214 B1 | 3/2007 |

OTHER PUBLICATIONS

Chinese Office Action, w/ English translation thereof, issued in Chinese Patent Application No. CN 200810176342.3 dated Jun. 7, 2010.

Korean Office Action, with English translation, issued in Korean Patent Application No. 10-2008-0096306, mailed Nov. 19, 2010.

Chinese Office Action, w/ English translation thereof, issued in Chinese Patent Application No. CN 200810176342.3 dated Mar. 15, 2011.

United States Office Action issued in U.S. Appl. No. 12/259,709 dated Mar. 1, 2011.

United States Office Action issued in U.S. Appl. No. 12/263,781 dated Mar. 2, 2011.

U.S. Office Action issued in U.S. Appl. No. 12/263,781, dated Feb. 16, 2012.

* cited by examiner

CHEMICAL VAPOR DEPOSITION APPARATUS

CROSS-REFERENCE TO RELATED APPLICATIONS

This application claims the priority of Korean Patent Application No. 2008-36094 filed on Apr. 18, 2008, in the Korean Intellectual Property Office, the disclosure of which is incorporated herein by reference.

BACKGROUND OF THE INVENTION

1. Field of the Invention

The present invention relates to a chemical vapor deposition apparatus, more particularly, in which a reaction gas is jetted from a side of a chamber.

2. Description of the Related Art

In general, a chemical vapor deposition (CVD) apparatus forms a thin film on a deposition object which typically includes a substrate such as a semiconductor wafer, by chemical reaction. Using this apparatus, a reaction gas with high vapor pressure is fed to a substrate heated inside a vacuum chamber, thereby growing a film of the reaction gas on the substrate.

Recently, the chamber and the susceptor have been increased in size to ensure a plurality of substrates, i.e., deposition objects are deposited at one time. Accordingly, growing a thin film uniformly on the plurality of deposition objects has emerged as a core technology.

As described above, to ensure the thin film is uniformly grown on the deposition objects, the reaction gas fed into the chamber may flow at a uniform rate.

However, the conventional chemical vapor deposition apparatus needs to be improved structurally to enable the reaction gas to flow at a uniform rate.

SUMMARY OF THE INVENTION

An aspect of the present invention provides a chemical vapor deposition apparatus improved in structure such that a reaction gas introduced into a reactor where deposition is performed flows at a substantially uniform rate to ensure a thin film is grown substantially uniformly on a deposition object.

According to an aspect of the present invention, there is provided a chemical vapor deposition apparatus including: a chamber; a reactor provided in the chamber to have a deposition object deposited therein; and a reservoir storing a reaction gas fed from the outside to introduce the reaction gas to the reactor, the reservoir having a cross-sectional area changing according to a flow path of the introduced reaction gas.

The chemical vapor deposition apparatus may further include a compartment member defining the reactor, compartmenting the reservoir from the reservoir and introducing the reaction gas stored in the reservoir into the reactor.

The reservoir may be formed such that a center of the reactor is eccentric from a center of the chamber.

The reservoir may include: a bigger flow path formed in an area where the reaction gas is introduced; a smaller flow path formed opposite to the bigger flow path to have a relatively smaller width; and a reduction flow path having a width gradually reduced from the bigger flow path toward the smaller flow path.

The reservoir may further include: a bigger flow path formed in an area from where the reaction gas is introduced; a smaller flow path formed opposite to the bigger flow path to have a relatively smaller width; and an expansion flow path having a width gradually expanded from the smaller flow path toward the bigger flow path.

The compartment member may include a porous member generating flow resistance of the reaction gas stored in the reservoir and supplied to the reactor.

The compartment member may include: a plate having a substantially ring shape and compartmenting the reactor from the reservoir, and a plurality of communication holes formed in the plate to keep the reservoir in communication with the reactor.

The compartment member may include: a plate having a substantially ring shape and compartmenting the reactor from the reservoir, and a plurality of slits formed in the plate to keep the reservoir in communication with the reactor.

The chemical vapor deposition apparatus may further include a wall protruded upward from a bottom of the reservoir where the reaction gas is introduced to diffuse the reaction gas.

The chemical vapor deposition apparatus may further include a guiding wall protruded upward from a bottom of the reservoir where the reaction gas is introduced, the guiding wall inclined in a flow direction at a predetermined angle to guide the reaction gas.

The reservoir may include a plurality of sub-reservoirs storing gases different in kind from one another.

The chemical vapor deposition apparatus may further include a screen provided in the reservoir to compartment the plurality of sub-reservoirs from one another.

The chemical vapor deposition apparatus may further include a sub-intake part connected to the plurality of sub-reservoirs, respectively to allow the different kinds of gases to be introduced into the sub-reservoir.

The chemical vapor deposition apparatus may further include a guiding part provided in at least one of the sub-reservoirs to guide the gas fed through the sub-intake part.

At least one of the plurality of sub-intake parts may be disposed substantially vertically, the guiding part comprises a curved guiding part formed in a curve to guide the gas fed vertically in a horizontal direction.

At least one of the plurality of sub-intake parts may be disposed substantially vertically, the guiding part includes an inclined guiding part inclined at a predetermined angle to guide the gas fed vertically in a substantially horizontal direction.

The chemical vapor deposition apparatus may further include a wall provided in at least one of the plurality of sub-reservoirs to diffuse the gas fed through the sub-intake part.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

First, a chemical vapor deposition (CVD) apparatus according to an exemplary embodiment of the invention will be described with reference to FIGS. 1 to 3.

Figure 1:
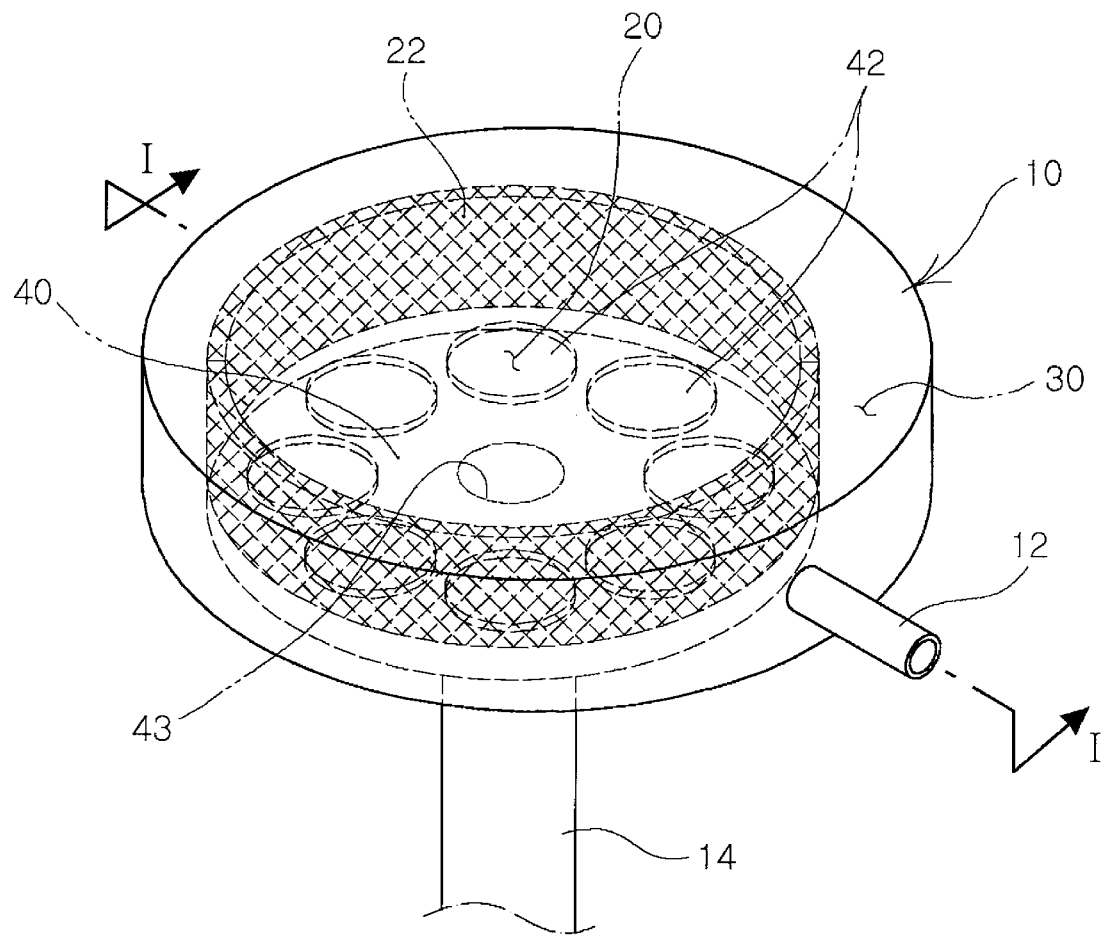
FIG. 1 is a perspective view schematically illustrating a chemical vapor deposition apparatus according to an exemplary embodiment of the invention.
Figure 2:
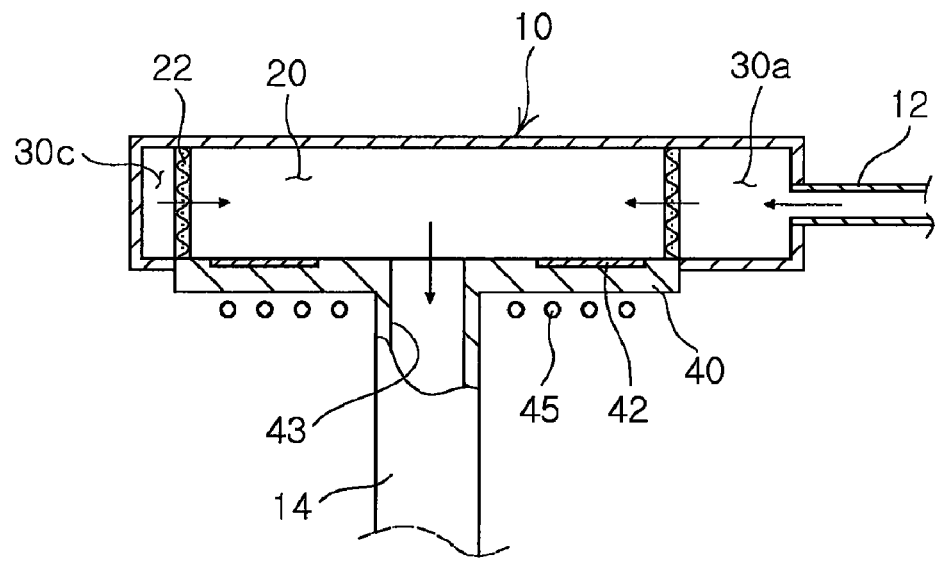
FIG. 2 is a side cross-sectional view illustrating an I-I cross-section of the chemical vapor deposition apparatus shown in FIG. 1.

FIG. 1 is a perspective view schematically illustrating a chemical vapor deposition apparatus according to an exemplary embodiment of the invention. FIG. 2 is a side cross-sectional view illustrating an I-I cross-section of the chemical vapor deposition apparatus shown in FIG. 1. FIG. 3 is a plan view illustrating a cross-section of the chemical vapor deposition apparatus shown in FIG. 1, cut in a horizontal direction;

As shown in FIGS. 1 and 2, the chemical vapor deposition apparatus of the present embodiment includes a chamber having a reactor 20 provided therein, a reservoir 30 formed around the reactor 20 and a susceptor 40 disposed in the reactor 20.

The reactor 20 and the reservoir 30 may be compartmented from each other in the chamber 10. The reactor 20 is provided therein with a gas flow area where a reaction gas fed from the reservoir 30 can flow, and has an exhaust hole 43 formed in a center thereof. The gas exhausted through the exhaust hole 43 is exhausted along an exhaust pipe 14.

The susceptor 40 is provided on a bottom of the reactor 20 to face upward in order to accommodate deposition objects 42. This allows the deposition objects 42 to be exposed to a gas flowing inside the reactor 20.

Also, as shown in FIG. 2, a heater 45 is disposed adjacently below the susceptor 40.

The reservoir 30 is disposed around a side end portion of the chamber 10 to provide a storage area for storing a predetermined gas. The reservoir 30 includes a gas intake part 12 in communication with an external gas supply source (not shown).

Also, in the chemical vapor deposition apparatus of the present embodiment, the reservoir 30 has a cross-section changing along a flow path of the reaction gas fed from the gas intake part 12.

When the gas is fed to the reservoir 30, the gas flows faster in an area adjacent to the gas intake part 12 of the reservoir 30 than the other area of the reservoir 30.

Therefore, this renders it hard for the gas to flow uniformly in the reservoir 30. However, as described above, the reservoir 30 has a cross-section changing along a flow path of the gas. That is, the area of the gas intake part 12 of the reservoir 30 has a cross-section different from a cross-section of the other area of the reservoir 30, thereby allowing the gas to flow uniformly in the reservoir 30. This will be described in further detail later.

Meanwhile, the chemical vapor deposition apparatus of the present embodiment includes a compartment member 22 compartmenting the reactor 20 from the reservoir 30 in the chamber 10. The compartment member 22 has an inner portion defining the reactor 20 and an outer portion defining the reservoir 30.

Figure 10A:
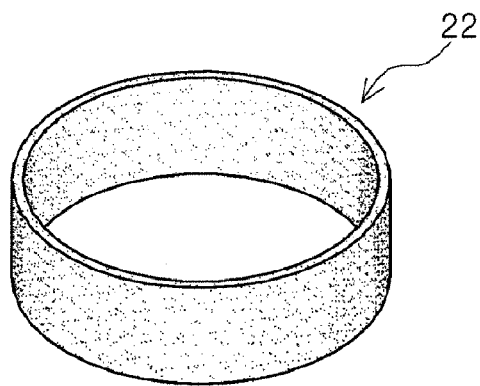
FIG. 10A is a perspective view schematically illustrating aporous compartment member.
Figure 10B:
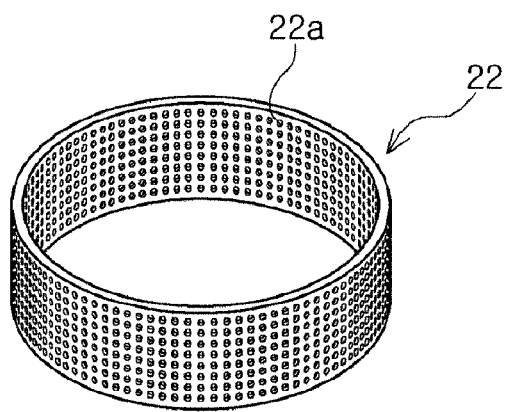
FIG. 10B is a perspective view schematically illustrating a compartment member with holes.
Figure 10C:
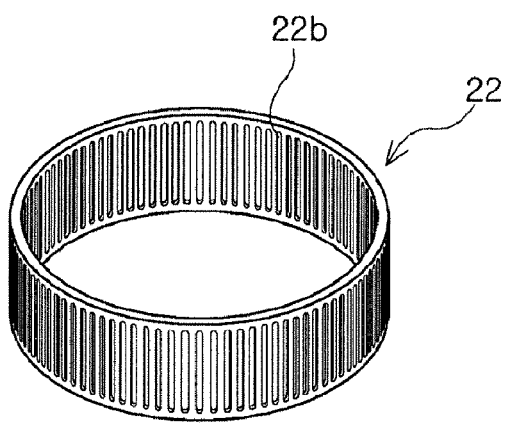
FIG. 10C is a perspective view schematically illustrating a compartment member with slits.

As shown in FIG. 10A, the compartment member 22 is formed of a porous member which generates flow resistance of the reaction gas stored in the reservoir and fed into the reactor. However, as shown in FIG. 10B or FIG. 10C, the compartment member 22 may adopt a plate member of a substantially ring shape having a plurality of communication holes 22a or slits 22b provided therein to compartment the reactor 20 from the reservoir 30.

That is, the compartment member 22 compartments the reactor 20 and the reservoir 30 from each other and allows the reaction gas stored temporarily in the reservoir 30 to be uniformly introduced into the reactor 20.

Moreover, the compartment member 22 allows a center of the reactor 20 to be eccentric from a center of the chamber 10 so that the reservoir 30 has a cross-section changing along a flow path.

That is, to change the cross-section of the reservoir 30 of the present embodiment, a reservoir whose cross-section is previously made to change may be inserted into an edge of the reactor 20. Alternatively, as shown in FIGS. 1 to 3, the compartment member 22 has a center eccentric from a center of the chamber 10 to change a cross-section of the reservoir 30.

Figure 3:
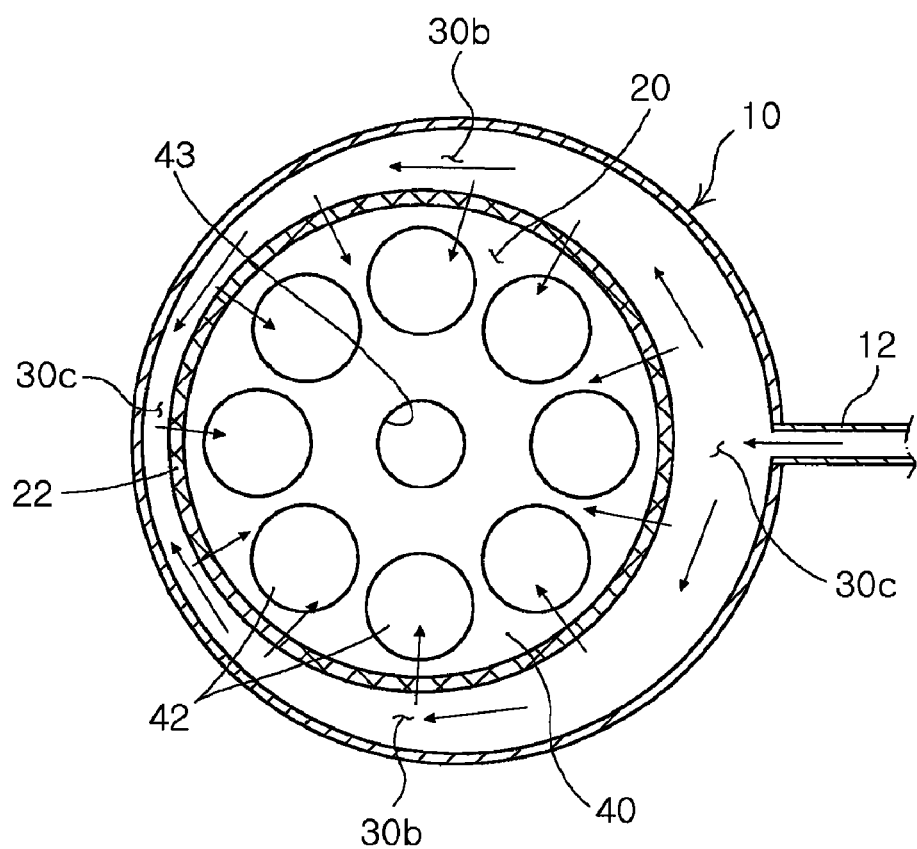
FIG. 3 is a plan view illustrating a cross-section of the chemical vapor deposition apparatus shown in FIG. 1, cut in a horizontal direction.

As shown in FIG. 3, in the chemical vapor deposition apparatus of the present embodiment, the compartment member 22 is biased toward a direction opposite to the gas intake part 12. This allows a center of the reactor 20 to be eccentric from a center of the chamber 10.

As described above, the reactor 20 is biased toward a direction opposite to the gas intake part 12 such that a center of the reactor 20 is eccentric from a center of the gas intake part. This allows the reservoir to form a bigger flow path 30a, a reduction flow path 30b, and a smaller flow path 30c.

The bigger flow path 30a has a relatively largest cross-sectional area in the reservoir, the smaller flow path 30c has a relatively smallest cross-sectional area in the reservoir, and the reduction flow path 30b is connected from the bigger flow path 30a to the smaller flow path 30c, and has a cross-sectional area gradually reduced along a flow path of the gas.

In the present embodiment, the bigger flow path 30a is formed in an area adjacent to the gas intake part 12, the smaller flow path 30c is formed in an area opposite to the gas intake part 12, and the reduction flow path 30b is formed to connect the bigger flow path 30a with the smaller flow path 30C.

The gas fed into the reservoir through the gas intake part 12 flows at the fastest rate and under the greatest pressure in an exit of the gas intake part 12.

In the present embodiment shown in FIG. 3, the gas fed from the gas intake part 12 has a pressure decreasing in the bigger flow path 30a and a cross-sectional area gradually reduced when flowing through the reduction flow path 30b. Accordingly, this ensures the gas to flow at a faster rate and thus flow toward the smaller flow path 30c.

In the end, this allows the gas to flow substantially at a uniform rate inside the reservoir, i.e., in the bigger flow path 30a, smaller flow path 30c, and reduction flow path 30b, respectively. Also, the gas intake part 12 and the compartment member 22 are spaced apart at a great distance from each other, thereby preventing the compartment member 22 from being impaired by pressure of the gas from the gas intake part 12.

As described above, the gas flowing substantially uniformly in the reservoir is fed into the reactor 20 through the compartment member 22 to grow a thin film on the deposition objects 42.

The chemical vapor deposition apparatus of the present embodiment shown in FIG. 3 ensures desirable results when the gas is introduced into the reservoir in a great flow amount, for example, when the chamber is very big or the gas flows at a very fast rate.

Meanwhile, a chemical vapor deposition according to another exemplary embodiment of the invention will be described with reference to FIG. 4.

Figure 4:
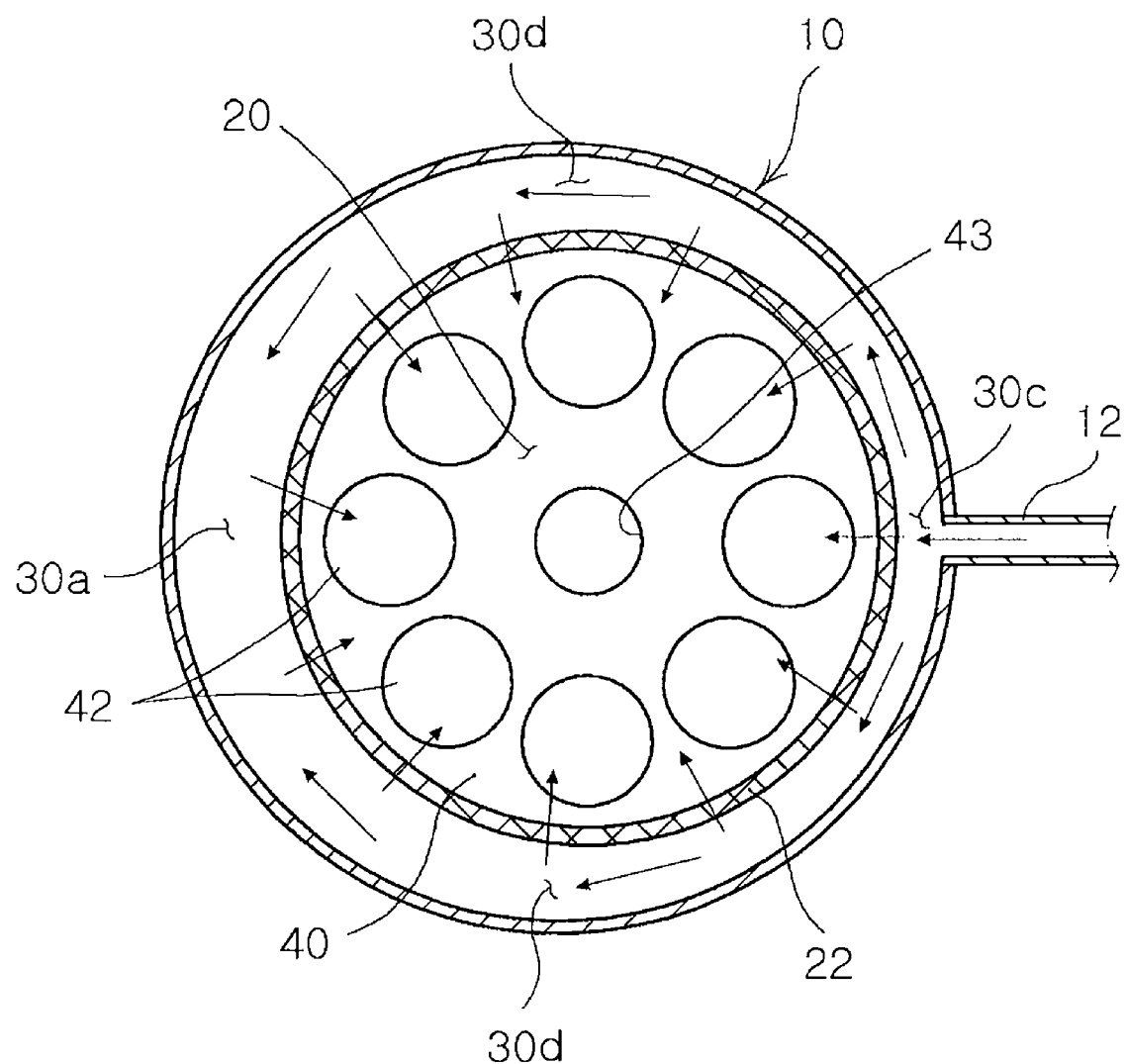
FIG. 4 is a plan view illustrating a cross-section of the chemical vapor deposition apparatus according to another exemplary embodiment of the invention, cut in a horizontal direction.

In the present embodiment shown in FIG. 4, a compartment member 22 compartments a chamber 10 into a reactor 20 and a reservoir, but a center of the reactor 20 is biased toward the gas intake part 12.

Therefore, the reservoir is structured such that a smaller flow path 30c is formed in an area adjacent to the gas intake part 12, a bigger flow path 30a is formed in an area opposite to the gas intake part 12, and an expansion flow path 30d is connected from the smaller flow path 30c to the bigger flow path 30a to have a cross-sectional area expanding gradually.

Therefore, the gas fed into the reservoir through the gas intake part 12 is expanded along the expansion flow path 30d and flows toward the bigger flow path 30a. That is, the gas fed into the reservoir is diffused from the smaller flow path 30c to the bigger flow path 30a along the expansion flow path 30d, thereby allowing the gas to flow substantially uniformly inside the reservoir.

The chemical vapor deposition apparatus of the present embodiment shown in FIG. 4 ensures desirable results when the gas fed into the reservoir flows in a relatively smaller flow amount than the present embodiment shown in FIG. 3, for example, when the chamber is relatively smaller than the embodiment shown in FIG. 3 or the gas flows at a slow rate.

In the present embodiment shown in FIG. 4, other parts than the reservoir are substantially identical to the embodiment shown in FIG. 3 and thus will not be described further.

Meanwhile, a chemical vapor deposition apparatus according to still another exemplary embodiment of the invention will be described with reference to FIGS. 5 and 6.

Figure 5:
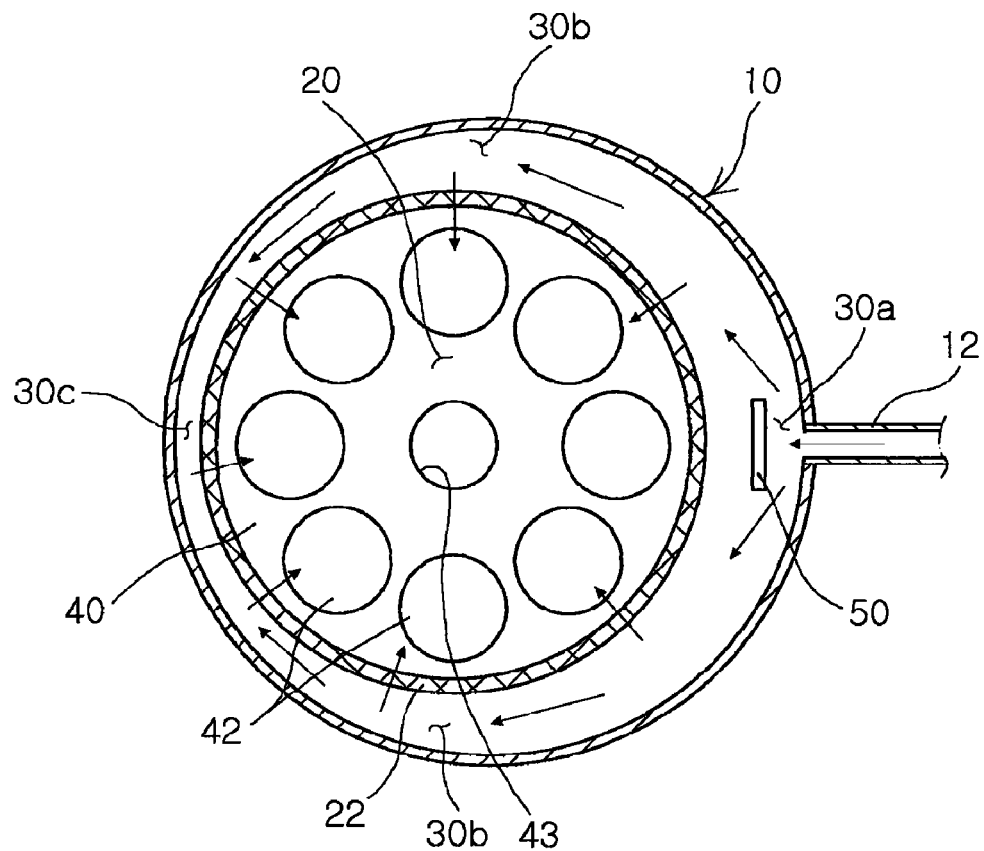
FIG. 5 is a plan view illustrating a chemical vapor deposition apparatus according to still another exemplary embodiment of the invention, cut in a horizontal direction.

FIG. 5 is a plan view illustrating a chemical vapor deposition apparatus according to still another exemplary embodiment of the invention, cut in a horizontal direction. FIG. 6 is a side cross-sectional view illustrating the chemical vapor deposition apparatus shown in FIG. 5.

Figure 6:
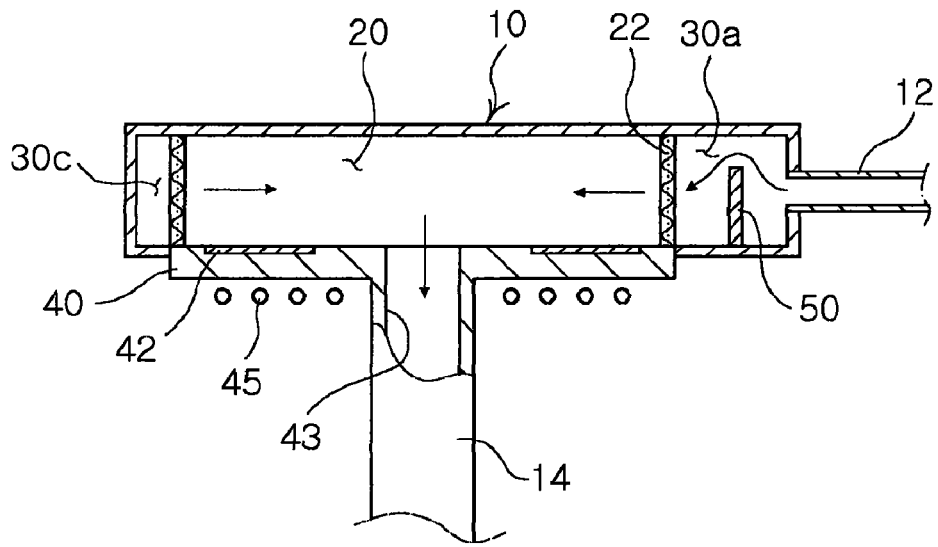
FIG. 6 is a side cross-sectional view illustrating the chemical vapor deposition apparatus shown in FIG. 5.

The present embodiment shown in FIGS. 5 and 6 is basically identical to the embodiment shown in FIG. 3. However, the chemical vapor deposition apparatus of the present embodiment further includes a wall 50 at an exit of the gas intake part 12, i.e., where the reaction gas is introduced.

This wall 50 inhibits the gas fed through the gas intake part 12 from being directly jetted into the compartment member 22, thereby preventing the compartment member 22 from being impaired.

As shown in FIG. 6, the wall 50 is protruded upward from a bottom of the reservoir and has an upper end spaced apart from a ceiling of the reservoir at a predetermined distance.

Due to the predetermined distance between the upper end of the wall 50 and the ceiling of the reservoir, the gas fed through the gas intake part 12 may be guided to flow over the wall 50 or guided to flow toward both sides of the wall 50.

That is, as shown in FIG. 5, a portion of the gas fed through the gas intake part 12 can be supplied toward the bigger flow path 30a of the reservoir. Also, the other portion of the gas can be guided toward the reduction flow path 30b. This allows the gas to flow uniformly to the reservoir overall.

FIGS. 5 and 6 illustrate the chemical vapor deposition apparatus of FIG. 3 which further includes the wall. But the present embodiment is not limited thereto. Such a wall may be installed in the chemical vapor deposition apparatus shown in FIG. 4.

In a case where the chemical vapor deposition apparatus of FIG. 4 further includes a wall, the wall may be provided in the smaller flow path, i.e., an area adjacent to the gas intake part of the reservoir.

A chemical vapor deposition apparatus according to yet another exemplary embodiment of the invention will be described with reference to FIG. 7.

Figure 7:
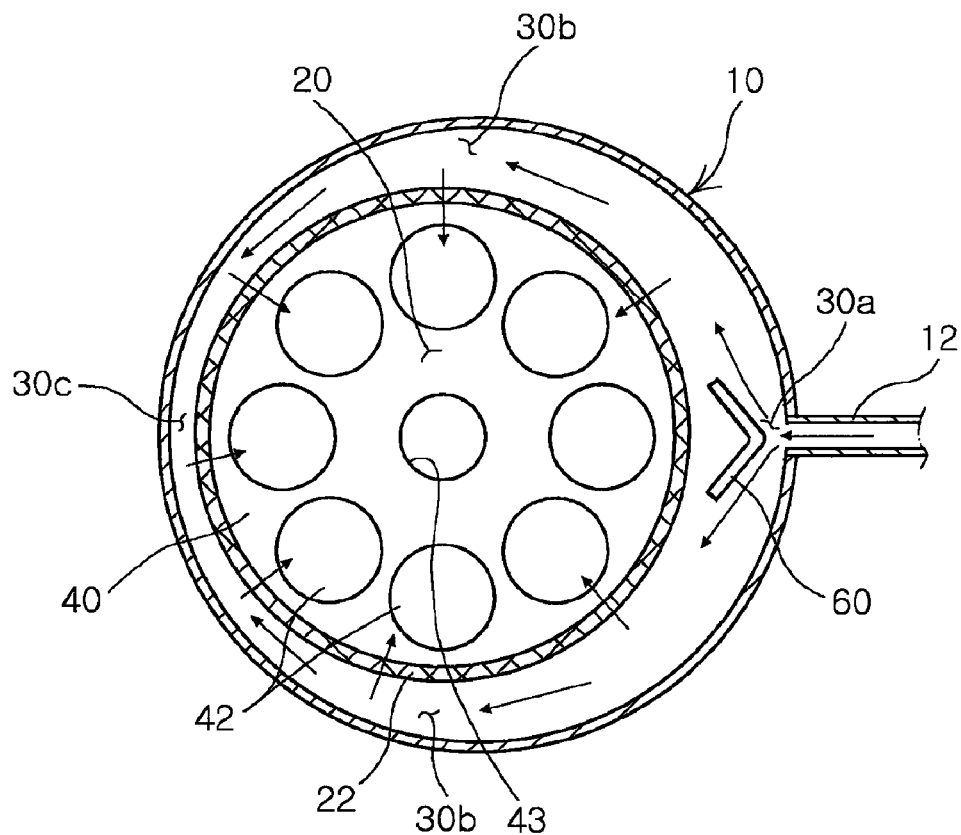
FIG. 7 is a plan view illustrating a chemical vapor deposition apparatus according to yet another exemplary embodiment of the invention, cut in a horizontal direction.

The present embodiment shown in FIG. 7 is basically identical to the embodiment shown in FIG. 3, but further includes a guiding wall 60 at an exit area of a gas intake part 12, i.e., where a reaction gas is introduced.

As shown in FIG. 7, the guiding wall 60 is protruded upward from a bottom of a reservoir and inclined at a predetermined angle in a flow direction of the gas to guide the reaction gas toward a reduction flow path 30b.

This guiding wall 60 inhibits the gas fed through the gas intake part 12 from being directly jetted into the compartment member 22, thereby preventing the compartment member 22 from being impaired.

Like the wall 50 shown in FIG. 6, the guiding wall 60 is protruded upward from the bottom of the reservoir and has an upper end spaced apart from a ceiling of the reservoir at a predetermined distance.

Due to the predetermined distance between the upper end of the wall 60 and the ceiling of the reservoir, the gas fed through the gas intake part 12 may be guided to flow over the wall 60 or guided to flow toward both sides of the wall 60.

That is, as shown in FIG. 7, a portion of the gas fed through the gas intake part 12 can be supplied toward a bigger flow path 30a of the reservoir. Also, the other portion of the gas can be guided toward the reduction flow path 30b. This allows the gas to flow uniformly to the reservoir overall.

FIG. 7 illustrates the chemical vapor deposition apparatus of FIG. 3 which further includes the guiding wall. But the present embodiment is not limited thereto. Such a wall may be installed in the chemical vapor deposition apparatus shown in FIG. 4.

In a case where the chemical vapor deposition apparatus of FIG. 4 further includes a guiding wall, the guiding wall may be provided in the smaller flow path, i.e., an area adjacent to the gas intake part of the reservoir.

Meanwhile, referring to FIGS. 1 to 7, the reservoir of the chemical vapor deposition apparatus of the present embodiments stores one kind of gas and supplies the gas to the reactor. But the present embodiments are not limited thereto. The reservoir may be divided into pluralities to store different kinds of gases and provide the gases to the reactors, respectively.

Figure 8:
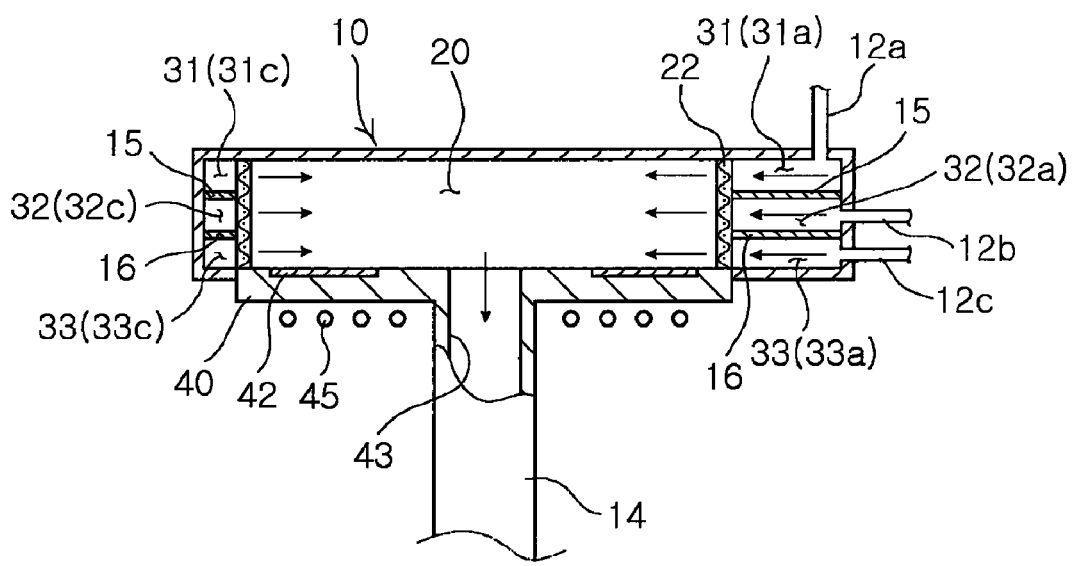
FIG. 8 is a side cross-sectional view illustrating a chemical vapor deposition apparatus according to a further exemplary embodiment of the invention.

That is, the reservoir can be divided to a plurality of sub-reservoirs. FIG. 8 illustrates a reservoir divided into three sub-reservoirs.

The present embodiment shown in FIG. 8 is basically identical to the embodiment shown in FIG. 2. But the present embodiment is different from the previous embodiment of FIG. 2 in terms of configuration of the reservoir. As shown in FIG. 8, the chemical vapor deposition of the present embodiment divides the reservoir into three sub-reservoirs of a predetermined size.

A first sub-reservoir 31 and a second sub-reservoir 32 are compartmented from each other by a first screen 15, and a second sub-reservoir 32 and a third sub-reservoir 33 are compartmented from each other by a second screen 16.

The sub-reservoirs 31, 32, and 33 are formed by dividing the reservoir and thus structured substantially identical to the reservoir shown in FIG. 3.

That is, the first sub-reservoir 31 includes a first bigger flow path 31a, a first smaller flow path 31c, and a first reduction flow path (not shown). Likewise, the second sub-reservoir 32 includes a second bigger flow path, 32a, a second smaller flow path 32c, and a second reduction flow path (not shown). Also, the third sub-reservoir 33 includes a third bigger flow path 32a, a third smaller flow path 32c, and a third reduction flow path (not shown).

A first gas sub-intake part 12a is connected to the first sub-reservoir 31a second gas sub-intake part 12b is connected to the second sub-reservoir 32 and a third gas sub-intake part 12c is connected to the third sub-reservoir 33.

A first gas is introduced into the first sub-reservoir 31 through the first gas sub-intake part 12a, a second gas is introduced into the second sub-reservoir 32 through the second gas sub-intake part 12b and a third gas is introduced into the third sub-reservoir 33 through the third gas sub-intake part 12c.

The first gas may be formed of a carrier gas, and the second and third gases may be formed of a material gas. Alternately, the second gas may be formed of a carrier gas. Of course, the first to third gases may be all formed of material gases.

Here, the material gas denotes a gas used as a material for deposition, the carrier gas denotes a gas enabling effective deposition by the material gas. That is, the carrier gas applies a pressure on the material gas to ensure the material gas forms a thin film on a deposition object more easily.

FIG. 8 illustrates the reservoir including three sub-reservoirs, but the present embodiment is not limited thereto. The reservoir may be divided into two sub-reservoirs. In this case, one screen divides the reservoir into two sub-reservoirs.

These two sub-reservoirs also have a structure and function identical to the sub-reservoirs 31, 32, and 33 shown in FIG. 8.

Furthermore, FIG. 8 illustrates the reservoir where the bigger flow path is formed in an area adjacent to the gas intake part, but the present embodiment is not limited thereto. Alternatively, in a case where the smaller flow path of the reservoir is formed in an area adjacent to the gas intake part, the reservoir may be divided into a plurality of sub-reservoirs.

A chemical vapor deposition apparatus according to a further exemplary embodiment of the invention will be described with reference to FIG. 9.

Figure 9:
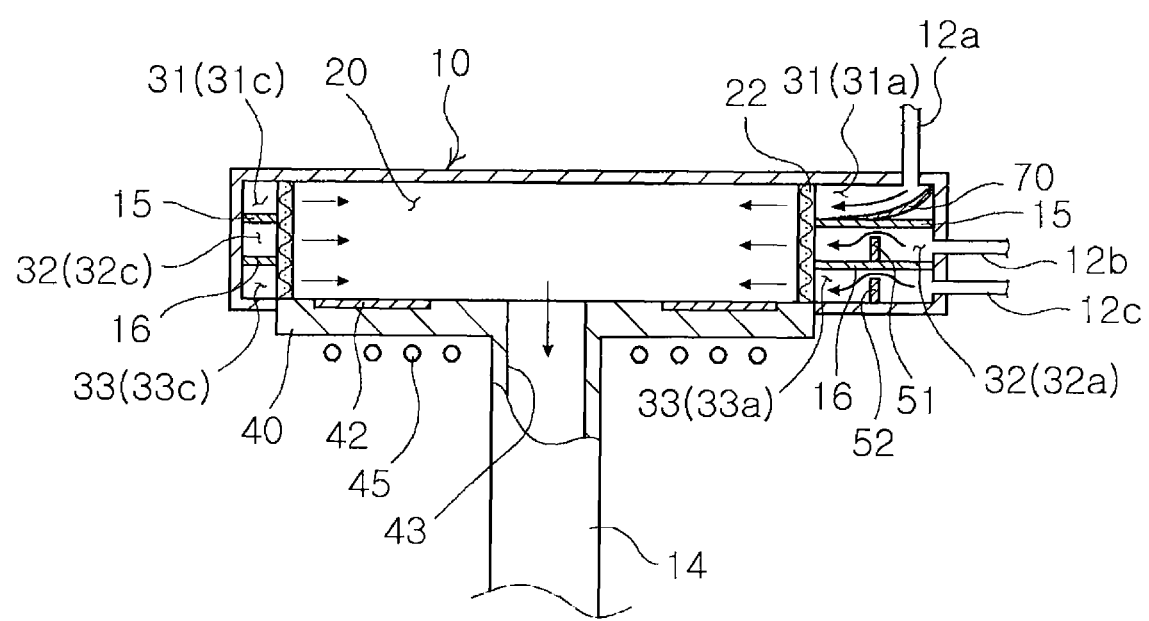
FIG. 9 is a side cross-sectional view illustrating a chemical vapor deposition apparatus according to a further exemplary embodiment of the invention.

The chemical vapor deposition apparatus shown in FIG. 9 is obtained by further providing a guiding part 70 in an area adjacent to a first gas sub-intake part 12a of a first sub-reservoir 31, a first wall 51 in an area adjacent to a second gas sub-intake part 12b of a second sub-reservoir 32 and a second wall 52 in an area adjacent to a third gas sub-intake part 12c of a third sub-reservoir 33, respectively to the chemical vapor deposition apparatus shown FIG. 8. Other constructions than this feature are identical to those of FIG. 8.

As shown in FIG. 9, the first gas sub-intake part 12a is connected to the first sub-reservoir 31 in a substantially perpendicular direction. Thus, the gas fed into the first sub-reservoir 31 flows perpendicularly at 90° degrees, potentially causing flow resistance.

Therefore, the guiding part 70 may be formed of a curved guiding part curved downward from the first sub-reservoir 31. This allows the first gas introduced vertically to flow substantially horizontally, while decreasing flow resistance.

Moreover, the guiding part 70 may be inclined downward from a side end of the first sub-reservoir 31. This allows the first gas introduced vertically to flow substantially horizontally, while reducing flow resistance.

Also, the first wall 51 provided in the second sub-reservoir 32 ensures more uniform flow of the gas fed into the second sub-reservoir 32. The function of the first wall 51 is substantially identical to the embodiment shown in FIG. 5, and thus will not be described further.

The second wall 52 may be provided in the third sub-reservoir 33 to function identically to the first wall 51.

Furthermore, the first and second walls may be formed of guiding walls, respectively. These guiding walls have been described in detail with reference to FIG. 7 and thus will be omitted.

Meanwhile, FIG. 9 illustrates the reservoir divided into three sub-reservoirs but the present embodiment is not limited thereto. The reservoir may be divided into two sub-reservoirs.

In a case where the reservoir is formed of the two sub-reservoirs, a guiding part is provided in an upper one of the sub-reservoirs and the wall or guiding wall may be provided in the lower sub-reservoir.

As set forth above, in a chemical vapor deposition apparatus according to exemplary embodiments of the invention, a reaction gas fed into a reactor where deposition is performed flows at a substantially uniform rate to ensure a thin film is grown substantially uniformly on a deposition object.

While the present invention has been shown and described in connection with the exemplary embodiments, it will be apparent to those skilled in the art that modifications and variations can be made without departing from the spirit and scope of the invention as defined by the appended claims.

What is claimed is:

1. A chemical vapor deposition apparatus comprising:
    a chamber having a substantially cylindrical shape;
    a reactor provided in the chamber to have a deposition object deposited therein;
    a reservoir storing a reaction gas fed from the outside to introduce the reaction gas into the reactor;
    a compartment member defining the reactor, compartmenting the reservoir from the reactor and introducing the reaction gas stored in the reservoir into the reactor,
    wherein:
    the reservoir is defined by the chamber and the compartment member,
    the reservoir is formed around a side portion of the chamber such that a center of the reactor is eccentric from a center of the chamber, and the reservoir having a cross-sectional area changing according to a flow path of the introduced reaction gas by the compartment member is eccentric from a center of the chamber, and
    the compartment member comprises a plate having a substantially ring shape configured to compartment the reactor from the reservoir.

2. The chemical vapor deposition apparatus of claim 1, wherein the reservoir comprises:
a bigger flow path formed in an area where the reaction gas is introduced;
a smaller flow path formed opposite to the bigger flow path to have a relatively smaller width; and
a reduction flow path having a width gradually reduced from the bigger flow path toward the smaller flow path.

3. The chemical vapor deposition apparatus of claim 1, wherein the reservoir comprises:
a bigger flow path formed in an area where the reaction gas is introduced;
a smaller flow path formed opposite to the bigger flow path to have a relatively smaller width; and
an expansion flow path having a width gradually expanded from the smaller flow path toward the bigger flow path.

4. The chemical vapor deposition apparatus of claim 1, wherein the compartment member comprises a porous member generating flow resistance of the reaction gas stored in the reservoir and supplied to the reactor.

5. The chemical vapor deposition apparatus of claim 1, the compartment member comprises:
a plurality of communication holes formed in the plate to keep the reservoir in communication with the reactor.

6. The chemical vapor deposition apparatus of claim 1, further comprising a wall protruded upward from a bottom of the reservoir where the reaction gas is introduced to diffuse the reaction gas.

7. The chemical vapor deposition apparatus of claim 1, further comprising a guiding wall protruded upward from a bottom of the reservoir where the reaction gas is introduced, the guiding wall inclined in a flow direction at a predetermined angle to guide the reaction gas.

8. The chemical vapor deposition apparatus of claim 1, wherein the reservoir comprises a plurality of sub-reservoirs storing gases different in kind from one another.

9. The chemical vapor deposition apparatus of claim 8, further comprising a screen provided in the reservoir to compartment the plurality of sub-reservoirs from one another.

10. The chemical vapor deposition apparatus of claim 8, further comprising a sub-intake part connected to the plurality of sub-reservoirs, respectively to allow the different kinds of gases to be introduced into the sub-reservoir.

11. The chemical vapor deposition apparatus of claim 10, further comprising a guiding part provided in at least one of the sub-reservoirs to guide the gas fed through the sub-intake part.

12. The chemical vapor deposition apparatus of claim 11, wherein at least one of the plurality of sub-intake parts is disposed substantially vertically,
the guiding part comprises a curved guiding part formed in a curve to guide the gas fed vertically in a horizontal direction.

13. The chemical vapor deposition apparatus of claim 11, wherein at least one of the plurality of sub-intake parts is disposed substantially vertically,
the guiding part comprises an inclined guiding part inclined at a predetermined angle to guide the gas fed vertically in a substantially horizontal direction.

14. The chemical vapor deposition apparatus of claim 10, further comprising a wall provided in at least one of the plurality of sub-reservoirs to diffuse the gas fed through the sub-intake part.

15. The chemical vapor deposition apparatus of claim 1, wherein the compartment member comprises a plurality of slits formed in the plate to keep the reservoir in communication with the reactor.

* * * * *